United States Patent
Zilkie et al.

(10) Patent No.: US 11,600,532 B2
(45) Date of Patent: Mar. 7, 2023

(54) INTEGRATED STRUCTURE AND MANUFACTURING METHOD THEREOF

(71) Applicant: ROCKLEY PHOTONICS LIMITED, Altrincham (GB)

(72) Inventors: Aaron Zilkie, Pasadena, CA (US); Andrew Rickman, Marlborough (GB); Damiana Lerose, Pasadena, CA (US)

(73) Assignee: Rockley Photonics Limited, Altrincham (GB)

(*) Notice: Subject to any disclaimer, the term of this patent is extended or adjusted under 35 U.S.C. 154(b) by 8 days.

(21) Appl. No.: 17/324,953

(22) Filed: May 19, 2021

(65) Prior Publication Data

US 2021/0335677 A1    Oct. 28, 2021

Related U.S. Application Data

(63) Continuation of application No. 16/317,171, filed as application No. PCT/EP2017/067767 on Jul. 13, 2017, now Pat. No. 11,037,839.

(Continued)

(51) Int. Cl.
*H01L 21/8238* (2006.01)
*H01L 21/8258* (2006.01)
(Continued)

(52) U.S. Cl.
CPC ........ *H01L 21/823821* (2013.01); *G02B 6/12* (2013.01); *G02B 6/131* (2013.01);
(Continued)

(58) Field of Classification Search
CPC ........ H01L 21/823821; H01L 21/8258; G02B 6/131; G02B 6/136
See application file for complete search history.

(56) References Cited

U.S. PATENT DOCUMENTS 6,345,131 B1    2/2002    Jang et al.
7,480,435 B2    1/2009    Brist et al.
(Continued)

FOREIGN PATENT DOCUMENTS

CN    1278605 A    1/2001
CN    101128088 A    2/2008
(Continued)

OTHER PUBLICATIONS

Chinese Notification of the First Office Action, for Patent Application No. 201780042757.9, dated Feb. 18, 2020, 12 pages.

(Continued)

*Primary Examiner* — Christine A Enad
(74) *Attorney, Agent, or Firm* — Lewis Roca Rothgerber Christie LLP

(57) ABSTRACT

A method for fabricating an integrated structure, using a fabrication system having a CMOS line and a photonics line, includes the steps of: in the photonics line, fabricating a first photonics component in a silicon wafer; transferring the wafer from the photonics line to the CMOS line; and in the CMOS line, fabricating a CMOS component in the silicon wafer. Additionally, a monolithic integrated structure includes a silicon wafer with a waveguide and a CMOS component formed therein, wherein the waveguide structure includes a ridge extending away from the upper surface of the silicon wafer. A monolithic integrated structure is also provided which has a photonics component and a CMOS component formed therein, the photonics component including a waveguide having a width of 0.5 μm to 13 μm.

18 Claims, 16 Drawing Sheets

Related U.S. Application Data

(60) Provisional application No. 62/362,012, filed on Jul. 13, 2016.

(51) Int. Cl.

| | | |
|---|---|---|
| *G02B 6/13* | (2006.01) | |
| *G02B 6/136* | (2006.01) | |
| *G02B 6/12* | (2006.01) | |
| *G02B 6/30* | (2006.01) | |
| G02B 6/42 | (2006.01) | |
| G02B 6/122 | (2006.01) | |
| H01L 21/762 | (2006.01) | |
| G02B 6/132 | (2006.01) | |
| G02B 6/134 | (2006.01) | |
| H01S 5/02 | (2006.01) | |

(52) U.S. Cl.
CPC ............ *G02B 6/136* (2013.01); *G02B 6/305* (2013.01); *H01L 21/8258* (2013.01); *G02B 6/12004* (2013.01); *G02B 6/1223* (2013.01); *G02B 6/132* (2013.01); *G02B 6/1347* (2013.01); *G02B 6/42* (2013.01); *G02B 2006/121* (2013.01); *G02B 2006/12038* (2013.01); *G02B 2006/12061* (2013.01); *G02B 2006/12097* (2013.01); *G02B 2006/12147* (2013.01); *G02B 2006/12152* (2013.01); *G02B 2006/12176* (2013.01); *G02B 2006/12178* (2013.01); *G02B 2006/12195* (2013.01); *H01L 21/7624* (2013.01); *H01L 21/76224* (2013.01); *H01L 21/76264* (2013.01); *H01S 5/021* (2013.01); *H01S 5/0216* (2013.01)

(56) References Cited

U.S. PATENT DOCUMENTS

| | | | |
|---|---|---|---|
| 2002/0131747 | A1 | 9/2002 | Roberts et al. |
| 2004/0013338 | A1 | 1/2004 | Bjorkman et al. |
| 2004/0114853 | A1 | 6/2004 | Bjorkman et al. |
| 2004/0121507 | A1 | 6/2004 | Bude et al. |
| 2010/0164039 | A1 | 7/2010 | Song |
| 2010/0276735 | A1 | 11/2010 | Spencer et al. |
| 2011/0012221 | A1 | 1/2011 | Kata et al. |
| 2012/0129302 | A1 | 5/2012 | Assefa et al. |
| 2012/0250007 | A1* | 10/2012 | Na .................. G01M 11/00 356/73.1 |
| 2012/0288971 | A1* | 11/2012 | Bogaerts ............. H01L 31/105 438/57 |
| 2014/0128701 | A1 | 5/2014 | Shults et al. |
| 2014/0191326 | A1 | 7/2014 | Assefa et al. |
| 2015/0010266 | A1 | 1/2015 | Webster et al. |
| 2017/0139132 | A1* | 5/2017 | Patel .................... G02B 6/4206 |
| 2018/0231714 | A1 | 8/2018 | Collins |
| 2019/0384003 | A1 | 12/2019 | Painchaud et al. |
| 2019/0391328 | A1 | 12/2019 | Li et al. |

FOREIGN PATENT DOCUMENTS

| | | |
|---|---|---|
| JP | 63-96638 A | 4/1988 |
| WO | WO 2016/018285 A1 | 2/2016 |

OTHER PUBLICATIONS

Chinese Notification of the Second Office Action, for Patent Application No. 201780042757.9, dated Sep. 11, 2020, 4 pages.
Chinese Notification of the Third Office Action, for Patent Application No. 201780042757.9, dated Mar. 3, 2021, 8 pages.
Fischer, Andreas C., "Integrating MEMS and ICs", Microsystems and Nanoengineering, May 28, 2015, pp. 1-16, IECAS.
International Search Report and Written Opinion of the International Searching Authority, dated Oct. 30, 2017, Corresponding to PCT/EP2017/067767, 21 pages.
Partial English translation of the Chinese Notification of the First Office Action, for Patent Application No. 201780042757.9, dated Feb. 18, 2020, 16 pages.
Partial English translation of the Chinese Notification of the Second Office Action, for Patent Application No. 201780042757.9, dated Sep. 11, 2020, 5 pages.
Partial English translation of the Chinese Notification of the Third Office Action, for Patent Application No. 201780042757.9, dated Mar. 3, 2021, 10 pages.
Smith, J.H., "Embedded Micromechanical Devices for the Monolithic Integration of MEMS with CMOS", 1995, pp. 609-612, IEDM.
U.K. Intellectual Property Office Examination Report, dated Jan. 4, 2021, for Patent Application No. GB1711282.2, 3 pages.
U.K. Intellectual Property Office Examination Report, dated Jul. 7, 2020, for Patent Application No. GB 1711282.2, 6 pages.
U.K. Intellectual Property Office Search Report, dated Aug. 14, 2017, for Patent Application No. GB 1711282.2, 4 pages.
U.S. Office Action from U.S. Appl. No. 16/317,171, dated Dec. 17, 2019, 11 pages.
U.S. Office Action from U.S. Appl. No. 16/317,171, dated Dec. 2, 2020, 10 pages.
U.S. Office Action from U.S. Appl. No. 16/317,171, dated Jul. 16, 2020, 13 pages.
Chinese Decision of Rejection, for Patent Application No. 201780042757.9, dated Aug. 3, 2021, 6 pages.
Partial English translation of the Chinese Decision of Rejection, for Patent Application No. 201780042757.9, dated Aug. 3, 2021, 11 pages.

\* cited by examiner

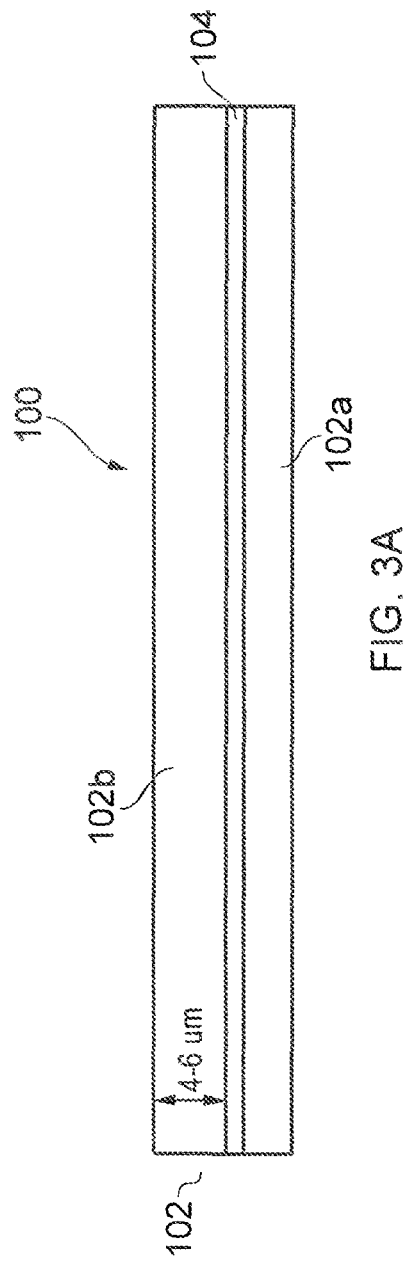
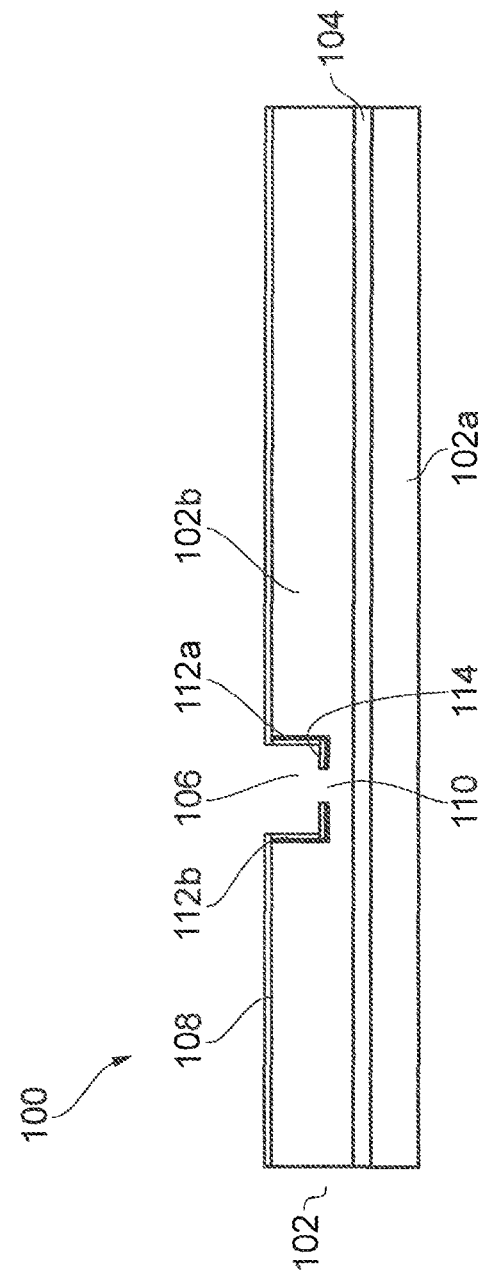

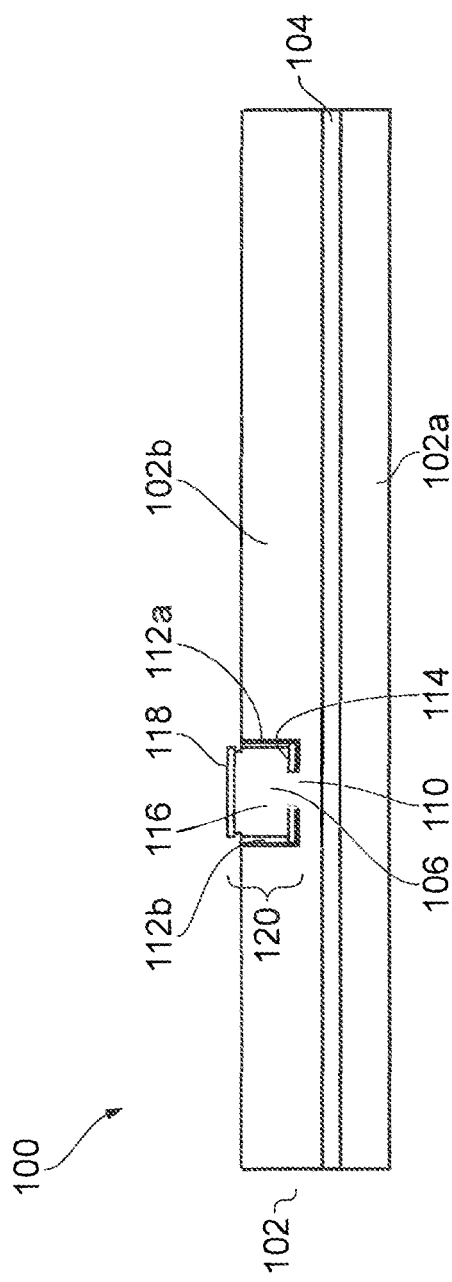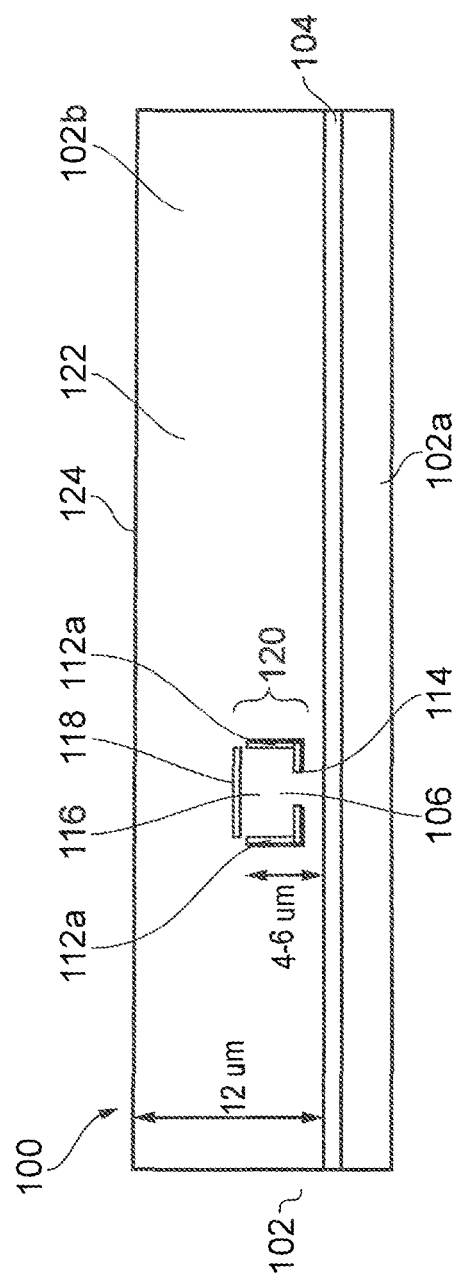

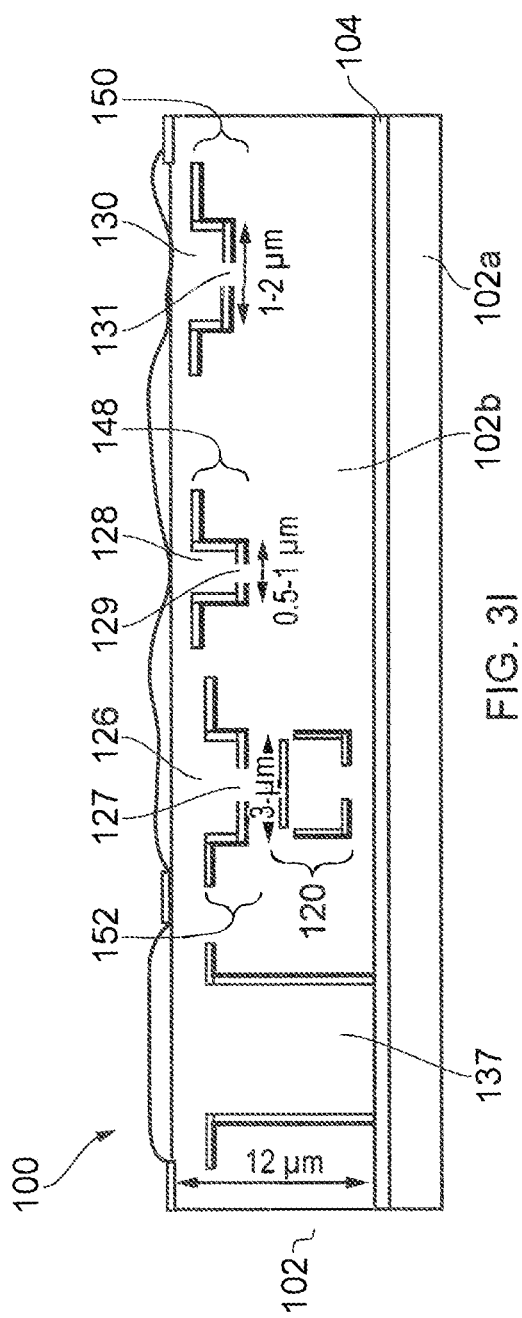
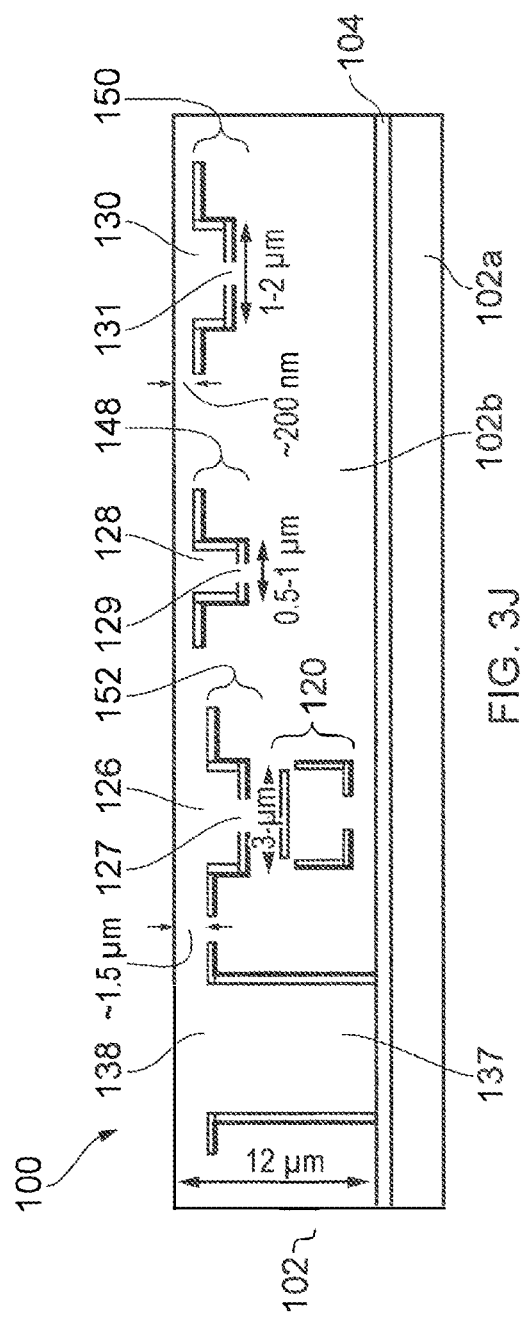
FIG. 3I
FIG. 3J

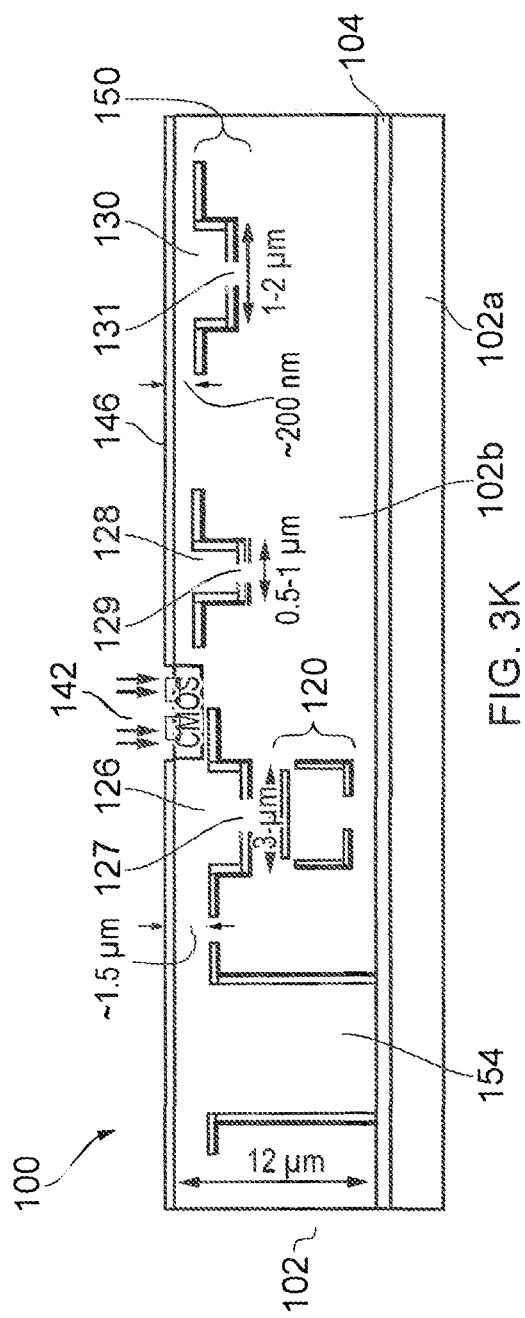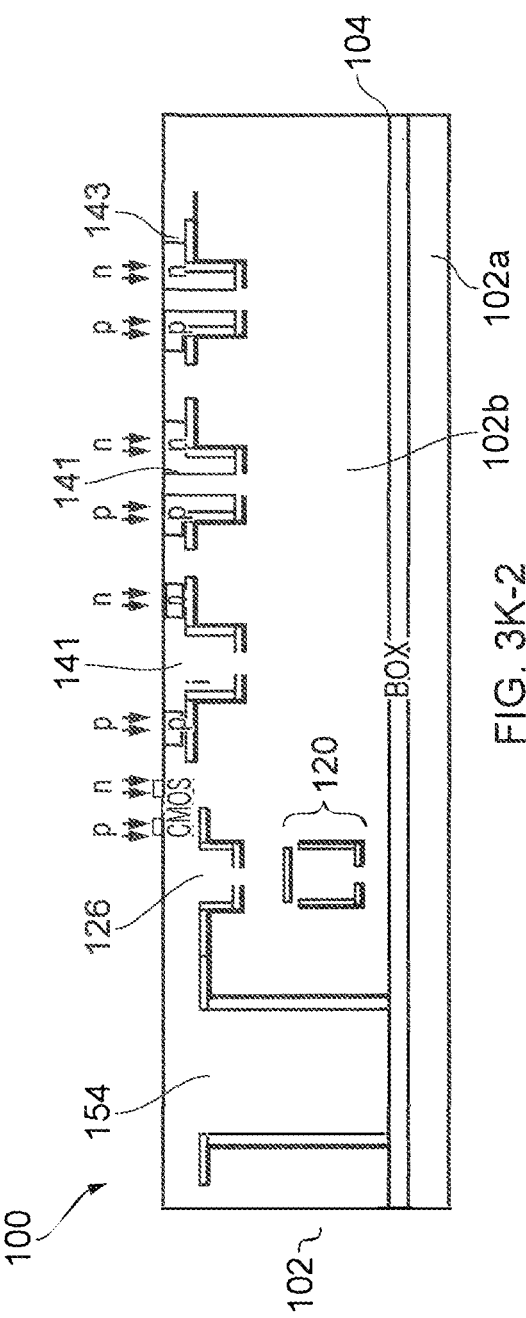

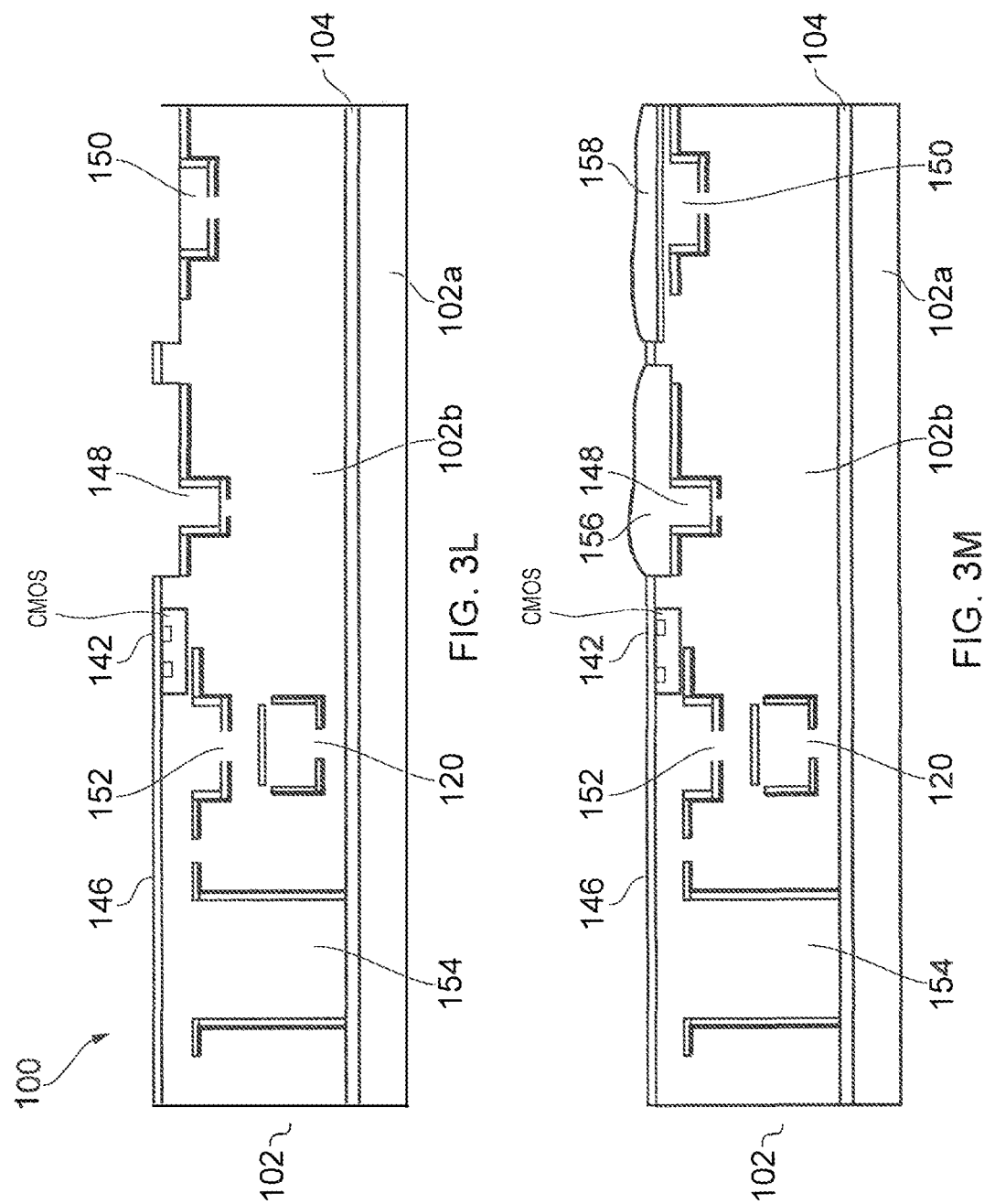

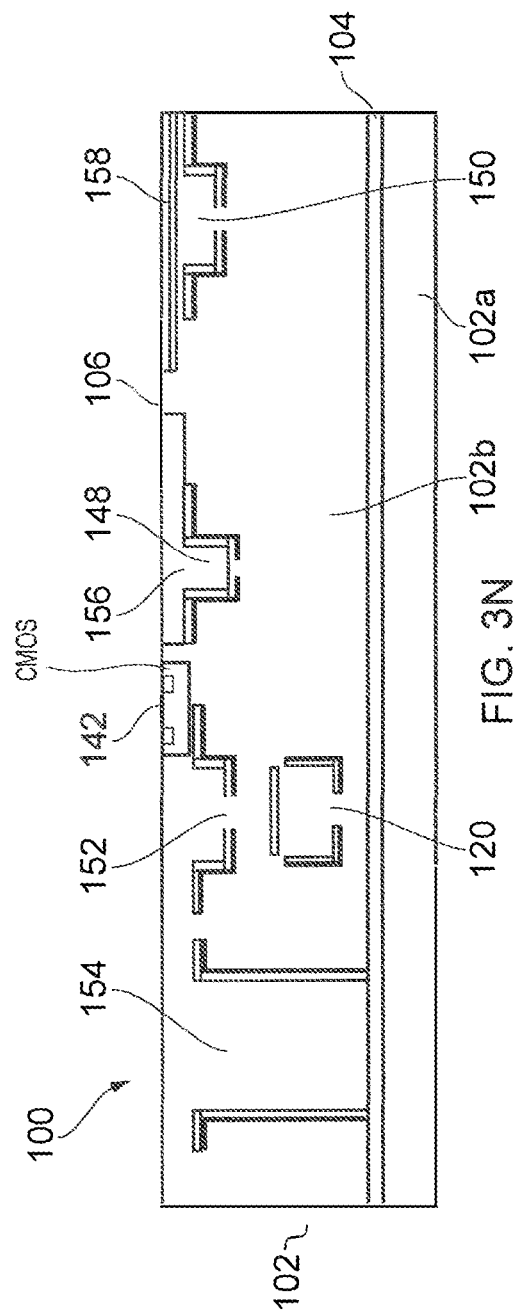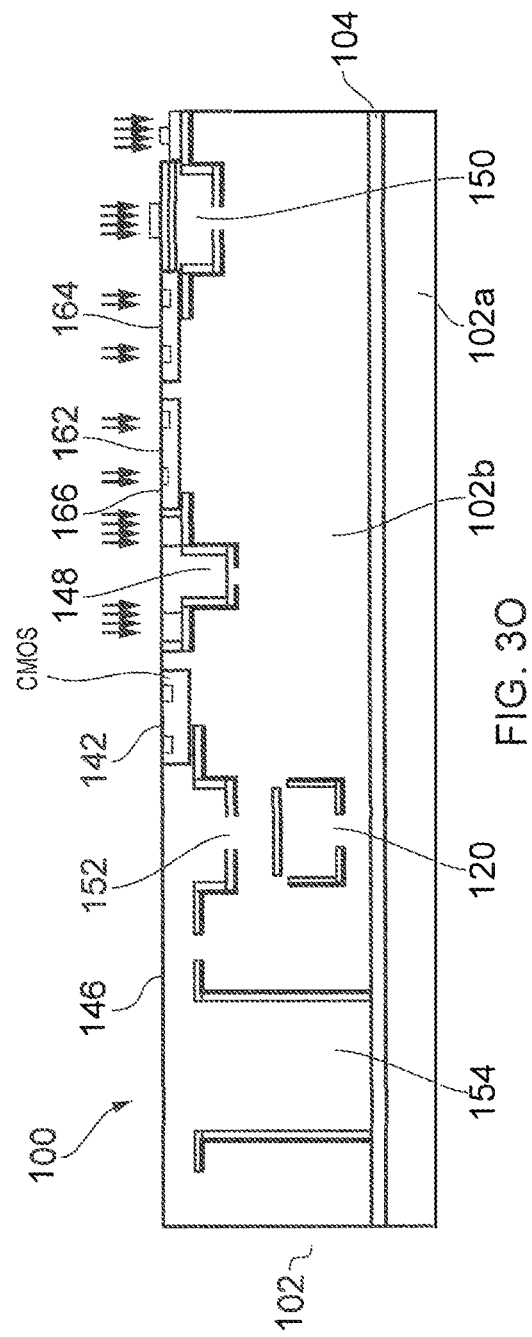

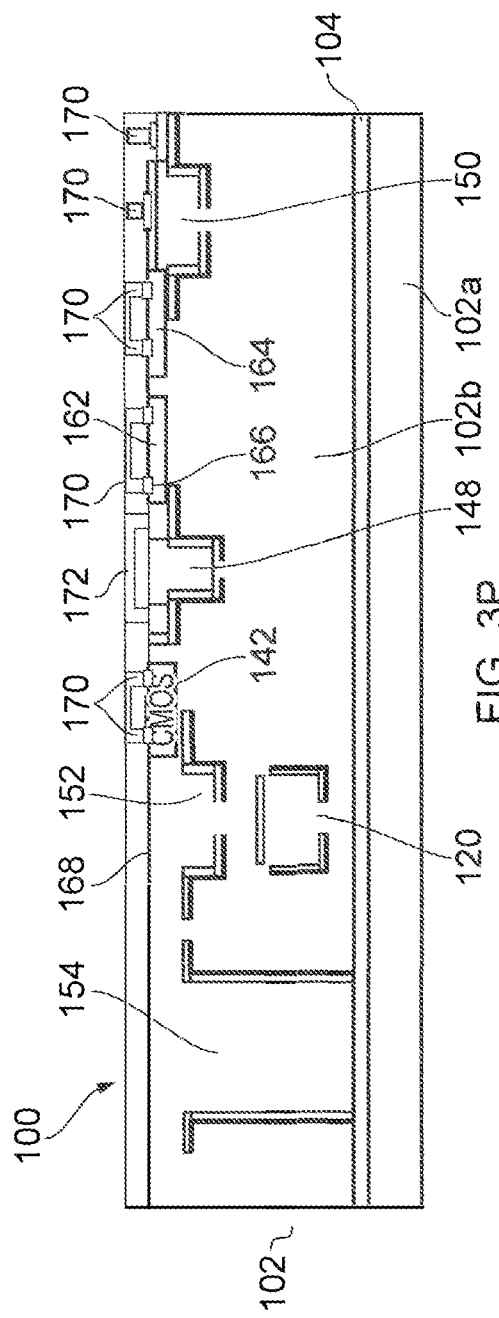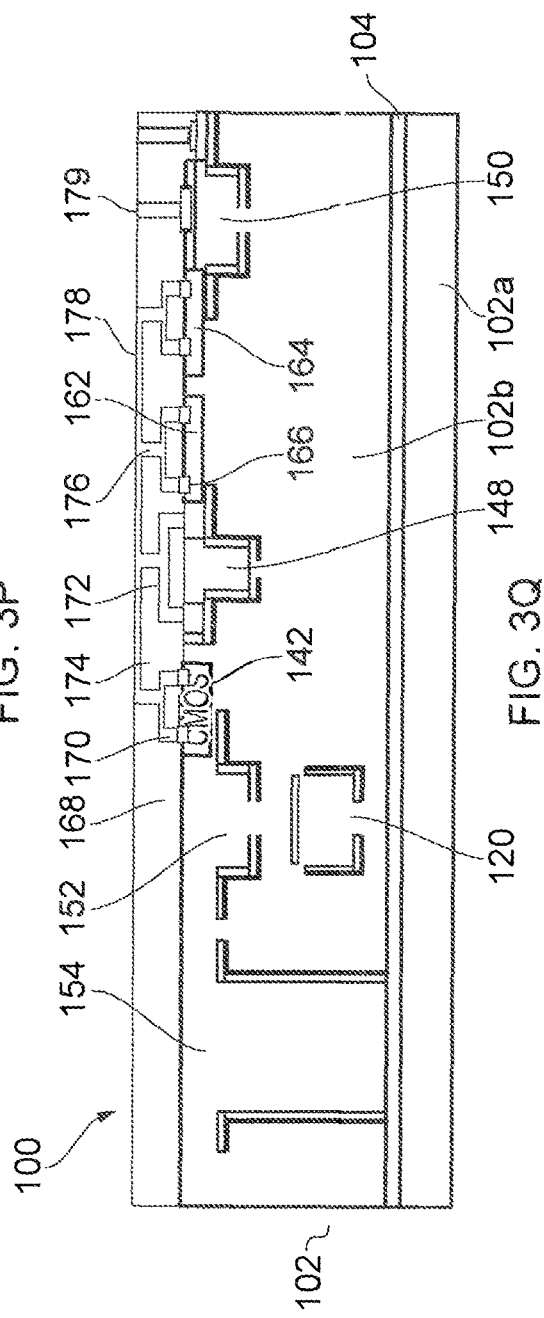

US 11,600,532 B2

INTEGRATED STRUCTURE AND MANUFACTURING METHOD THEREOF

CROSS-REFERENCE TO RELATED APPLICATION(S)

The present application is a continuation of U.S. patent application Ser. No. 16/317,171, filed Jan. 11, 2019, entitled "INTEGRATED STRUCTURE AND MANUFACTURING METHOD THEREOF", which is a U.S. National Phase patent application and claims priority to and the benefit of International Application Number PCT/EP2017/067767, filed on Jul. 13, 2017, entitled "INTEGRATED STRUCTURE AND MANUFACTURING METHOD THEREOF", which claims priority to and the benefit of U.S. Provisional Patent Application No. 62/362,012, filed on Jul. 13, 2016, entitled "BURIED INVERTED TAPER AND MONOLITHIC INTEGRATION OF PHOTONICS WITH CMOS"; the entire contents of all of the documents identified in this paragraph are incorporated herein by reference.

TECHNICAL FIELD OF THE INVENTION

The present invention relates to a method of manufacturing an integrated structure containing both photonic components and complementary metal-oxide-semiconductor (CMOS) components. The invention also relates to the integrated structure itself.

BACKGROUND TO THE INVENTION

As CMOS technologies move to smaller node sizes (n14, n10, n7, n5, n3) in order to keep up with Moore's Law, transistors will be made with silicon, SiGe, GaAs and III-V FinFET structures. This is illustrated in FIG. 1. These material systems are also used in silicon photonics, and the present invention relates to how photonics integrated circuits and CMOS may be integrated together with a monolithic process flow.

Integrating CMOS structures monolithically with photonics is far from straightforward. In particular, the integration of CMOS with large-μm waveguide structures is challenging to achieve. In one known example, integration is achieved, by making the silicon photonics using the tools and processes available in a CMOS line. This is disadvantageous since the resulting photonics devices are limited only to those who may be fabricated using CMOS line equipment, such as small waveguide sizes, low topology, CMOS-only material systems, such as no SiGe with a high germanium content, which is required for Franz-Keldysh modulators.

In another known example, monolithic integration of silicon photonics with Bi-CMOS (a combination of CMOS technology with bipolar junction transistor technology) is achieved using a Bi-CMOS fabrication process. Again, the disadvantage here is that photonics which are fabricated using Bi-CMOS fabrication equipment are limited in their feature sizes, topologies and materials.

SUMMARY OF THE INVENTION

Broadly speaking, the present invention aims to solve the problems outlined above in the provision of a method of fabricating an integrated structure using a CMOS line and a photonics line. In this way, monolithic integration of photonics with CMOS is achieved, which allows for ultra-high integration densities and optical IO, which may be integrated with high speed electronics, without the requirement for high speed electrical traces. This technology has the potential to be ground-breaking for the transmission of data over any distance, dramatically reducing power consumption and packaging costs of systems involving integration of electronics and photonics. Furthermore, this is particularly relevant given that there are indications that CMOS is moving towards SiGe, GaAs and III-V FinFETs in order to keep up with Moore's Law.

Specifically, a first aspect of the present invention provides a method for fabricating an integrated structure using a fabrication system having a CMOS line and a photonics line, the method including the steps of:

in the photonics line, fabricating a first photonics component in a silicon wafer;

transferring the wafer from the photonics line to the CMOS line;

in the CMOS line, fabricating a CMOS component in the silicon wafer.

As is clear from the method set out above, the present invention prepares or fabricates the photonics component in the photonics line and the CMOS component in the CMOS line. In doing so, the components are fabricated using equipment which is specially adapted for that purpose, meaning that particularly the photonics components may have more desirable features particularly with regard to their size, material properties and nature, than they would if they had been fabricated using CMOS technology alone.

In the present application, by the term "integrated", we mean that all of the components of the final device are preferably present on the same chip, which is preferably monolithic. In other words, the integrated structure is preferably in the form of an integrated chip. It is this integration which enables the desirable combination of high-density communications and digital processing, together with power and packaging cost reduction, so clearly the greater the degree of integration, the more powerful the invention.

In order to define various structural features of the invention, it is useful to define certain geometric terms to be used throughout this application. This will be done relative to the silicon wafer which forms the starting point for the fabrication process of the first aspect of the present invention. Silicon wafers are well-known in the technical field of the present invention to be generally planar, and to have two generally flat surfaces. The surface on which the majority of the initial fabrication processes, i.e. those which form the CMOS and photonics components, is herein referred to as the "top surface" or "upper surface". Then, the surface opposite this one is herein referred to as the "base", "bottom surface" or "lower surface". The direction from the bottom to the top surface may be referred to as "up" (or equivalent), and the direction from the top surface to the bottom surface may be referred to as "down" (or equivalent). Relative terms such as "higher", "lower", "over", "under", "above" and "below" follow the same pattern. Along a similar vein, the plane of the silicon wafer may define a broadly "horizontal" direction (and accordingly, "widths" or "breadths", and the direction broadly perpendicular to this may define a "vertical" direction (and accordingly "heights", "depths" or "thicknesses").

The first photonics component is preferably a waveguide, and preferably has a width of no less than 0.5 μm, more preferably no less than 1 μm, more preferably still no less than 2 μm, and even more preferably still no less than 3 μm. In preferred embodiments, the width is preferably no more than 13 μm, more preferably no more than 12 μm, more preferably no more than 11 μm, more preferably no more than 10 μm, more preferably no more than 9 μm, more preferably no more than 8 µm, more preferably no more than 7 µm, more preferably no more than 6 µm, and more preferably no more than 5 µm. Fabricating a waveguide on this scale is not possible using conventional CMOS technology (as in the prior examples noted above), which is only able to fabricate waveguides on a far smaller scale, generally only up to 0.2 µm. A primary advantage of this invention lies in the use of both photonics and CMOS techniques in the production of the integrated structure. Specifically, the use of photonics techniques to produce the photonic components, particularly waveguides, is especially beneficial since it is possible to produce larger-scale waveguides. The advantage of these are multiple: firstly, larger waveguides have a higher tolerance to manufacturing imperfections or variations, i.e. a surface defect or dimension variation in a larger waveguide will have, proportionally, a far smaller effect on the loss or phase of the light propagating through a large waveguide compared with a small one. This means that the large waveguides enabled by the present method are generally less lossy and more phase stable. Secondly, large waveguides allow for polarization independence: small waveguides that can be made in CMOS manufacturing lines have optical mode properties that are highly polarization dependant, whereas in larger waveguides the optical mode properties can be made unchanging over different polarization states. Thirdly, large waveguides allow for lower loss and manufacturable coupling to optical fibre, and also coupling schemes to fibre that operate over a broad bandwidth. Therefore, larger waveguides are able to make photonic integrated circuits that operate over a broader range of wavelengths than those made with smaller waveguides.

Waveguides are generally elongate in shape, and have a rectangular or substantially rectangular cross-section in a plane perpendicular to the wave propagation direction. The dimensions of the rectangular cross-section determine the modes which may be supported by a given waveguide. In preferred embodiments, the waveguide is a silicon waveguide, which is surrounded around its rectangular cross-section by an oxide layer, which acts to confine the waves therein. It should be noted that here, "surrounded" does not necessarily imply that the silicon channel is fully surrounded, and there may be gaps in the oxide layer. It is preferred that the silicon channel is substantially surrounded by the oxide layer though.

In preferred embodiments of the present invention, the waveguide is inverted.

Specifically, the step of fabricating the first photonics component, which is preferably in the form of a waveguide includes:
  etching a cavity into a top surface of the silicon wafer;
  depositing an oxide layer on walls of the cavity;
  filling the cavity with silicon; and
  depositing an oxide cap on top of the silicon which is used to fill the cavity.

It is preferred that the cavity have a substantially rectangular cross section and that the walls include side walls and a bottom wall.

In forming the waveguide in this manner, the part of the waveguide that forms the channel is etched and then refilled. This is what is meant by "inverted". Furthermore an inverted rib or ridge waveguide has its slab regions (regions of the sidewalls that do not have oxide confinement) at the top of the waveguide, whereas in a traditional rib or ridge waveguide the slab is at the bottom. It is in contrast to conventional methods for forming waveguide structures, in which the silicon is deposited on a buried oxide layer, and then the silicon in the regions on either side of the channel is etched away, before depositing an oxide layer on the remaining "bump" in order to form the waveguide. The inventors recognize that this is still a viable technique which may apply to embodiments of the present invention. However, one advantage of the inverted waveguide fabrication is that traditional slab regions where diodes are formed can be made to line up at the top of the wafer, so that diode implantation and annealing steps, oxide filling and metallization steps can be done together with low topology in the CMOS line, in order to avoid thermal budget management problems. In other words the photonic components are able to share the implantation steps with the CMOS.

In some embodiments of the invention, the fabricating step may further include, after depositing an oxide layer on the bottom wall and side walls of the cavity, forming (e.g. by etching) a slot in the wall, preferably a bottom wall, of the cavity, to expose the silicon underneath. In such embodiments, filling the cavity with silicon preferably includes epitaxial growth of silicon onto the silicon exposed by the slot in the bottom wall of the cavity. It is noted that the skilled person is well-aware of other methods by which the cavity may be filled with silicon. It should be noted that the term "fill" should not necessarily be understood to mean "completely fill", it may also be used to refer to "substantially fill".

In some embodiments of the present invention, the method may include a step, after fabricating of the first photonic component, of depositing a layer of silicon on top of the first photonic component, to bury the first photonic component. This burial may occur by epitaxial growth, and the waveguide may be referred to as a buried waveguide. In these embodiments, and indeed all others in which epitaxial growth (or any other kind of silicon deposition) takes place, there may be a step of flattening the upper surface of the silicon, e.g. by normal chemical mechanical planarization processes.

Sometime after, but not necessarily immediately after, the fabrication of the first photonics component, the silicon wafer is transferred to the CMOS line, where CMOS processing takes place. Specifically, the CMOS processing includes the step of fabricating the first CMOS component. Herein "CMOS processing" refers to any conventional CMOS techniques which are carried out in the CMOS line. Furthermore, the term "CMOS component" refers to any component which is formed using conventional CMOS processing. In preferred embodiments, the CMOS component includes an integrated circuit. The step of fabricating the CMOS component preferably includes implantation or doping.

After the step of fabricating a CMOS component in the silicon wafer, the method may further include the steps of:
  transferring the wafer from the CMOS line to the photonics line; and
  in the photonics line, fabricating a second photonics component in the silicon wafer.

In this way, additional components may be formed into the integrated structure. This optional feature highlights one of the key advantages of the method of the present invention, i.e. that in order to form additional photonics components, the silicon wafer is transferred back to the photonics line, rather than continuing processing in the CMOS line.

In some embodiments, fabricating the second photonics component may include the same steps as fabricating the first component, as exemplified earlier in this application. In such embodiments, the second photonics component is a passive component such as a waveguide.

In preferred embodiments, the second photonics component includes an optically active region, formed of an optically active material. Accordingly, in some embodiments, the step of fabricating the second photonics component may include:

etching a cavity into a top surface of the silicon wafer;
  depositing an oxide layer on walls of the cavity; and
  filling the cavity with an optically active material to form an optically active region.

In such embodiments, the second photonics component may be referred to as an active component.

In other embodiments, the step of fabricating the second photonics component may include:

etching a cavity into a top surface of the silicon wafer;
  depositing an oxide layer on walls of the cavity;
  filling the cavity substantially with silicon; and
  depositing an optically active material on top of the silicon, to form an optically active region.

In such embodiments, the second photonics component may be referred to as an evanescent active component.

In some embodiments, the method may also include a step of fabricating a third photonics component, also in the photonics line. The third photonics component may be fabricated the same way as the first and second photonics components, as described above. The method may further include steps of fabricating additional photonics components, also in the photonics line. These may be prepared in prepared as the same way as any of the first, second or third photonics components.

The second photonic component, third photonic component and/or any additional photonic components, are preferably in the form of an active component such as: a photodiode, a modulator (e.g. an electro-absorption modulator, or a phase shifter), an amplifier, or a laser, made with active materials that are different than silicon.

Accordingly, the term "active material" refers to material which imparts some kind of photonic electro-optic or non-linear optic property to the second photonics component or third photonics component. Specifically, the active material may include one or more of: germanium (for a Ge photo-detector), SiGe bulk or heterostructure stacks (e.g. multiple quantum well stacks) (for Franz-Keldysh or Quantum-Confined-Stark-Effect [QCSE] electro-absorption modulators or phase shifters respectively), SiGeSn or GeSn bulk or heterostructure stacks (for electro-absorption modulators and phase shifters) or III-V compound bulk or heterostructure stacks (for lasers, amplifiers, electro-absorption modulators, phase shifters, or photodiodes). In this application, a "III-V compound" is one containing at least one of: boron, aluminium, gallium, indium and thallium, and at least one of: nitrogen, phosphorus, arsenic, antimony and bismuth. Particularly preferred III-V materials include InAlGaAs or InGaAsP multiple-quantum-well heterostructures on InP bulk layers for making laser gain regions, or QCSE modulator and phase shifter regions.

After fabrication, in the photonics line, of the photonics components, the method may include additional steps of transferring the silicon wafer to the CMOS line to perform additional CMOS processing. This may include forming conductive traces on the upper surface of the integrated structure.

In order to provide conductive traces on the upper surface of the integrated structure, the method may further include the following steps: depositing an oxide layer on top of the silicon wafer; forming one or more vias within the oxide layer, the vias running from an opening on the upper surface of the oxide layer to a conductive pad on the upper surface of the silicon wafer; metallizing the vias and the upper surface of the oxide layer to form one or more conductive traces. The same steps may be performed again in order to generate a multi-layered structure which means that mixed-signal analogue circuitry are connected up with multiple metal layers so that mixed-signal analogue circuitry drives EAM function and are also connected to digital functions.

A second aspect of the present invention provides a monolithic integrated structure including a silicon wafer with a waveguide and a CMOS component formed therein, wherein the waveguide includes a ridge extending away from an upper surface of the silicon wafer. This is the inverted waveguide structure as discussed earlier in the claim. A third, broader aspect of the present invention may also provide an optoelectronic device including a silicon wafer with a waveguide located therein, the waveguide including a ridge extending away from an upper surface of the silicon wafer.

More specifically, in the case of both of the aspects of the invention set out in the previous paragraph, the silicon wafer may be in the form of a silicon-on-insulator (SOI) wafer and include a buried oxide layer (a BOX layer). The waveguide structure may be formed as specified earlier in the application, and may include side walls and a base to form a substantially U-shaped ridge, the substantially U-shaped ridge defining propagation region of the waveguide. To say that the ridge extends away from an upper surface of the silicon wafer should be understood to mean that the base of the U-shaped ridge is located at the ends of the side walls which are furthest from the upper surface of the silicon wafer. In the case where the silicon wafer is in the form of an SOI wafer, the base is preferably located at the ends of the side walls which are furthest from the upper surface of the silicon wafer and closest to the BOX layer. The advantages of such an inverted waveguide structure are set out earlier in this application.

Another, fourth aspect of the present invention provides a monolithic integrated structure including a silicon wafer having a waveguide and a CMOS component formed therein, wherein the photonic component includes a waveguide having a cross-section with a width of 0.5 µm to 13 µm.

Embodiments of the structures/devices of the second, third and fourth aspects of the invention may include any of the optional features set out earlier in the application with reference to the first aspect of the invention. Though the first aspect of the invention is directed towards a method, the skilled person will appreciate that the optional method steps give rise to structural features which may be incorporated into the structures/devices of the second, third and fourth aspects of the present invention.

BRIEF DESCRIPTION OF THE DRAWINGS

The present invention is herein described with reference to the drawings, in which.

DETAILED DESCRIPTION OF THE DRAWINGS

Figure 1:
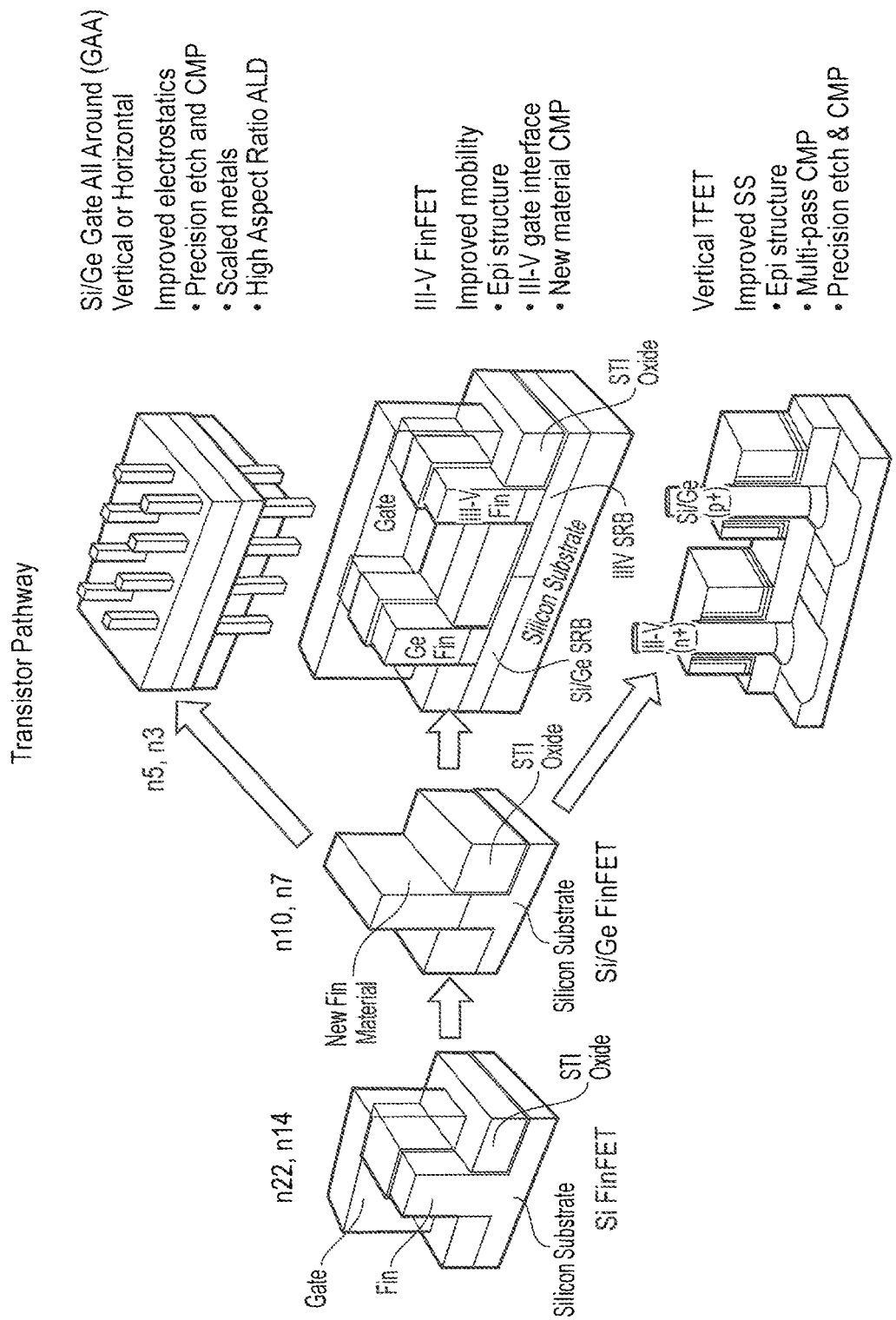
FIG. 1 shows an illustration of how CMOS technologies are moving to smaller node sizes in order to keep up with Moore's Law and the different materials that are required to be integrated into silicon for these technologies.
Figure 2:
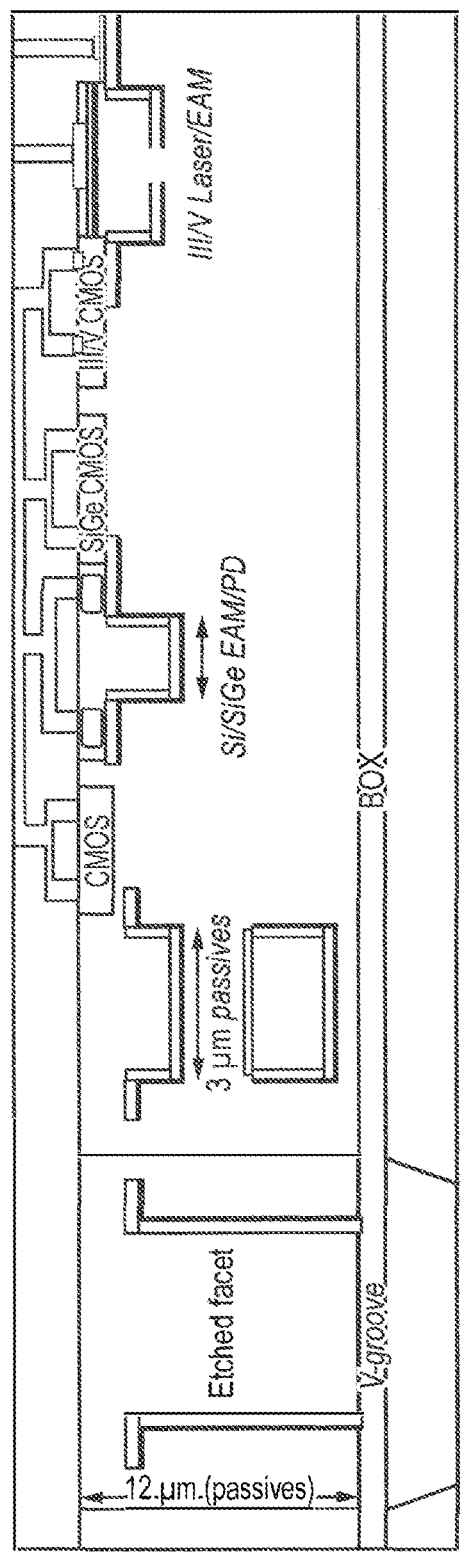
FIG. 2 shows a sideways cross-section of an integrated structure according to an embodiment of the present invention.

FIG. 2 shows a cross-section of an integrated structure according to an embodiment of the present invention. FIGS. 3A to 3R show a series of fabrication steps which may be employed to produce the integrated waveguide structure of FIG. 2, which includes a monolithic silicon wafer containing two buried waveguides (i.e. passive components), each 3 μm wide. Of course the present invention is suitable to provide any number of waveguides within the monolithic silicon wafer. The structure also includes a Si/SiGe EAM/PD and a III/V laser/EAM/amplifier/phase shifter. These photonic components are integrated into the same silicon wafer (i.e. monolithically) as three CMOS components labelled CMOS, SiGe CMOS and III/V CMOS, which are connected to conductive layers. The structure also includes an etched facet and a V-groove. These components are all described in more depth with reference to FIGS. 3A to 3R.

One of the distinguishing features of the present invention rests with the fact that a combination of CMOS and silicon photonics techniques may be employed to manufacture a highly integrated single structure. The process set out in FIGS. 3A to 3R includes steps which are performed in a "photonics line" and steps which are performed in a "CMOS line". A unique feature of this fabrication method is having large-μm waveguides, silicon photonic tools (such as MEMS line tools) mixed in the same clean room, together with CMOS line tools. This means that wafers can be interchanged between the CMOS line/MEMS line/photonics line as needed.

Steps 3A to 3J take place in the photonics line.

Figure 5:
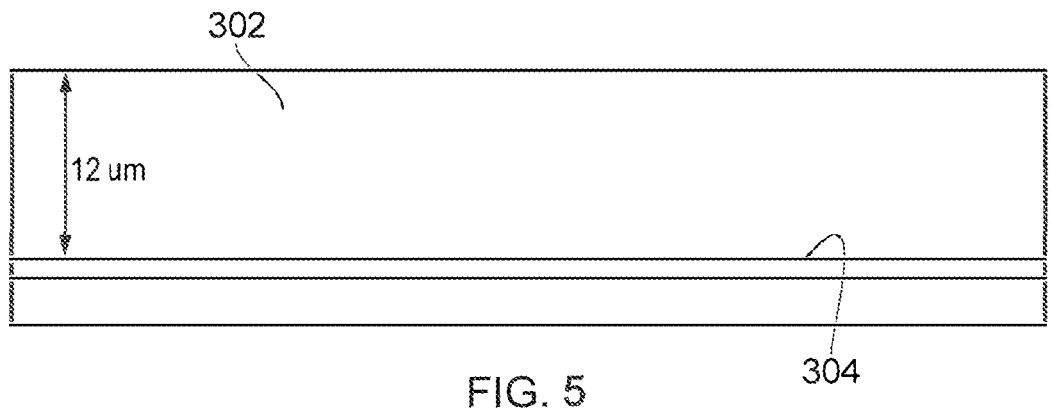
FIG. 5 shows an alternative starting point for a method similar to that illustrated in FIGS. 3A to 3R FIGS. 6A to 6D illustrate various points in an alternative fabrication method, using a different starting from that in FIGS. 3A to 3R.

FIG. 3A shows a possible starting arrangement form which the integrated waveguide structure of the present invention may be fabricated. Alternative starting arrangements are shown in FIGS. 5 and 6, and are discussed in more depth later on in this application. In FIG. 3A, the starting point for the invention is a 4 to 6 μm silicon-on-insulator (SOI) wafer. In the present example, the SOI wafer 102 includes a substrate 102a such as a silicon handle wafer, above which is a buried oxide (BOX) layer 104, which may be formed, for example, from silicon dioxide. A silicon device layer 102b is located on top of the BOX layer, the silicon device layer having a thickness of 4 to 6 μm.

The next step is shown in FIG. 3B, in which a cavity 106 is etched into the silicon device layer 102b. In the present example, the cavity 106 is to form a waveguide, as will be discussed in greater depth later. The cavity 106 may be formed, for example (not shown) by deposition of a hard mask layer over the device layer. For example, the hard mask layer may be a thermally grown silicon dioxide layer grown from a silicon device layer 102b. The hard mask acts as a sacrificial layer that may subsequently be removed. It functions as an effective etch mask and protection layer for silicon device layer 102b.

The structure of the cavity 106 which is to form the waveguide may be patterned using photolithography, and the silicon device layer 102b are then etched to form the cavity 106 itself. It is preferred that a dry etch process is used in order to maintain good dimensional control of the etched features. After etching the cavity 106 in the device layer 102b, a layer of oxide 108 is deposited all over the side walls 112a, 112b and base 114 of the cavity, and the top surface of the silicon device layer 102b, for example using a low pressure chemical vapour deposition (LPCVD) technique. A small slot 110 is then opened in the oxide layer 108 at the base of the cavity 106.

Figure 3C:
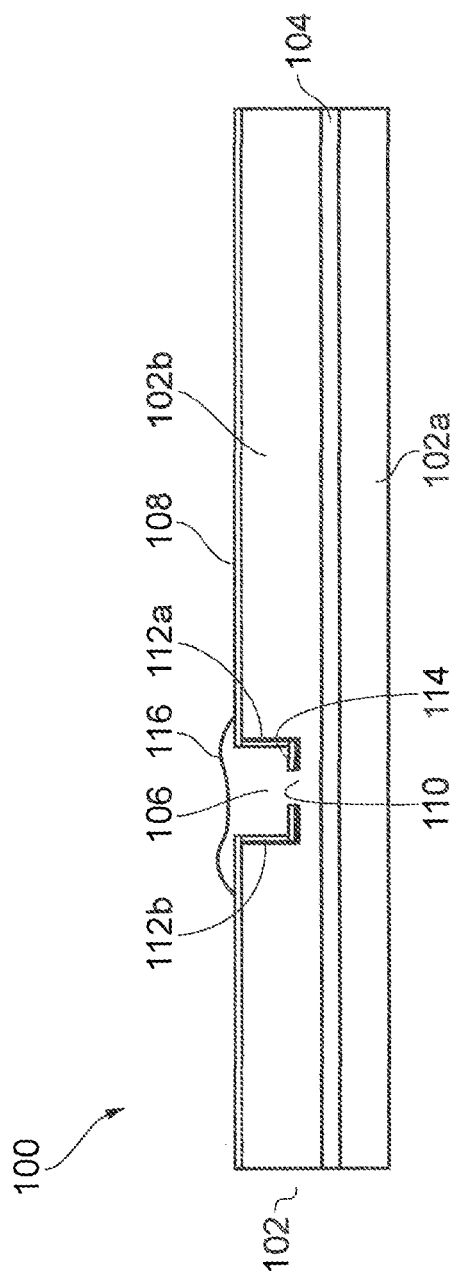
FIGS. 3A to 3R show the fabrication steps employed in the production of the integrated structure of FIG. 2, according to an embodiment of the invention.
Figure 3D:
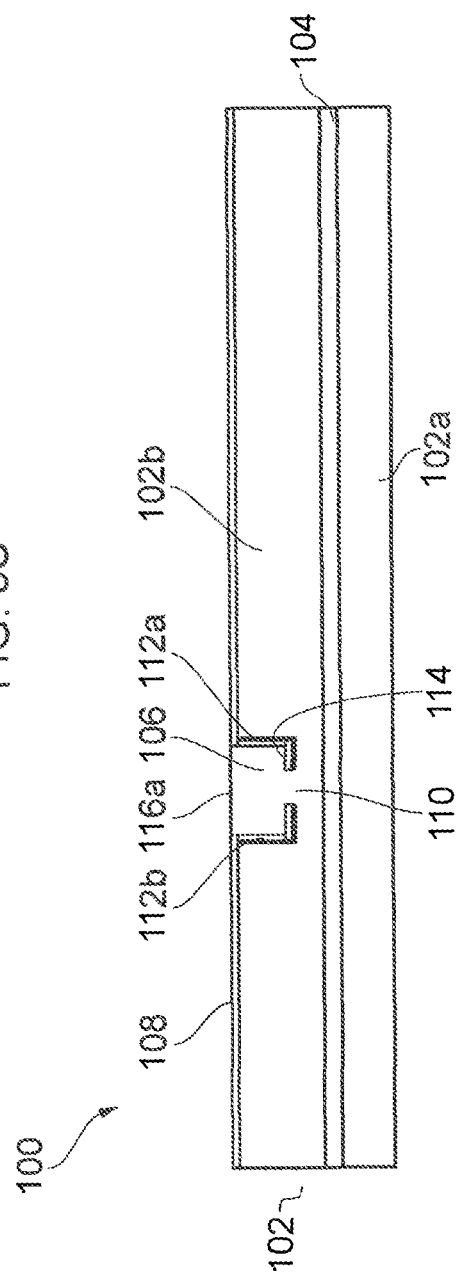

Next, as shown FIG. 3C, the cavity 106 is filled with silicon 116. In the example shown, the (crystalline) silicon 116 is grown epitaxially in the cavity with the portion of the silicon device layer 102b which is exposed by the small slot 110 in the oxide layer 108 at the base 114 of the cavity 106 acting as a seed for crystalline growth. However, in other embodiments of the present invention (not shown), the cavity 106 may be filled with silicon in other ways. For example, crystalline silicon may be placed into the cavity and bonded. Alternatively, amorphous silicon may be grown on the oxide layer and subsequently converted into crystalline silicon by, for example, annealing. Alternatively, crystalline silicon may be grown directly on the oxide layer. In the next step, depicted in FIG. 3D, the upper surface of the deposited silicon 116a is flattened to be flush with the surface of the oxide layer 108 using any suitable conventional chemical-mechanical planarization process.

FIG. 3E shows the result of the next step. After the upper oxide layer 108 is removed, e.g. by a selective etch such as a wet chemical etch, an oxide cap 118 is deposited on the surface of the flattened silicon surface 116a, specifically, between the oxide sidewalls 112a, 112b which were deposited in the step shown in FIG. 3B. In doing so, the silicon channel bounded by the walls 112a, 112b, 114 of the cavity 106 and the oxide cap 118 defines the silicon waveguide 120. This method of forming the waveguide 120 differs from traditional techniques employed in the technical field of the present invention, since the waveguide 120 is built "upside down". The techniques employed in the prior art (see e.g. Reed "Silicon Photonics: The State of the Art", Wiley 2008), rather than defining a cavity by etching, forming oxide sidewalls, and then filling in the cavity, instead etch away (down to the BOX layer) all of the silicon which is not to be part of the waveguide structure, and subsequently coat the remaining "hump" with oxide. The advantages of the inverted nature of the waveguides will become apparent later in the description. In FIG. 3F, more silicon 122 is deposited epitaxially on top of the entire structure, and the upper surface 124 flattened in another CMP process, to give a thickness of 12 μm, the waveguide 120 being "buried" around 6 to 8 μm beneath the upper surface 124 of the integrated structure 100. A set of waveguides 120 formed in the manner described up until now preferably acts as a passive optical structure such as an AWG or the like. In some embodiments an AWG or similar passive optical structure may be formed in the top layer waveguides 126 discussed below. Buried waveguides 120 discussed above may be used to provide waveguide crossings, e.g. passing light underneath an AWG (or other low loss waveguides) or may act as a light source bus waveguide network to bring in light from a laser and distribute the laser light throughout the chip. Active optical structures are discussed in more depth later on.

Figure 3G:
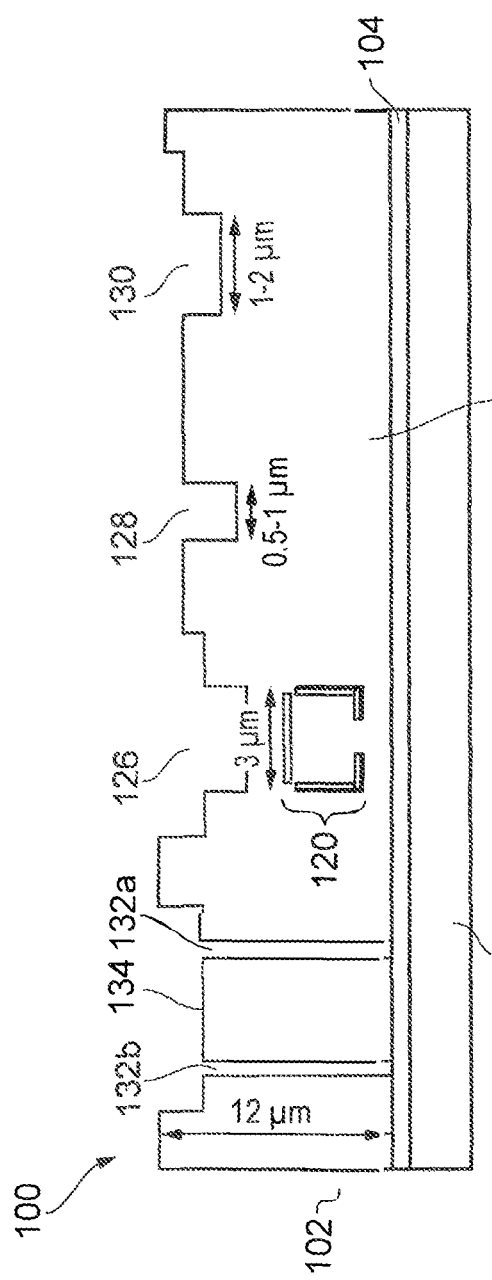
Figure 3H:
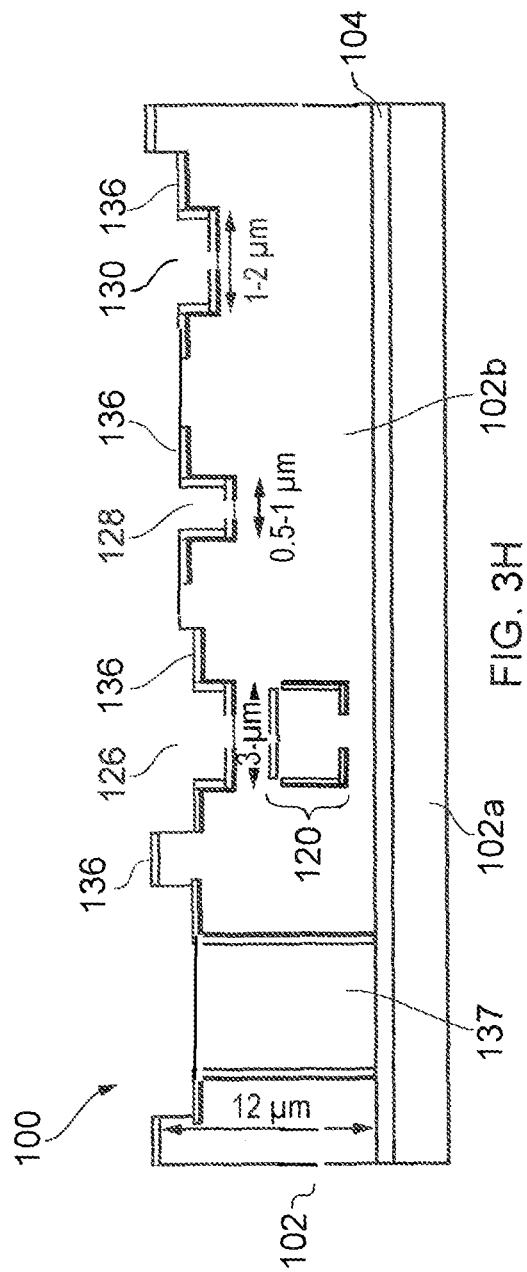
Figure 3R:
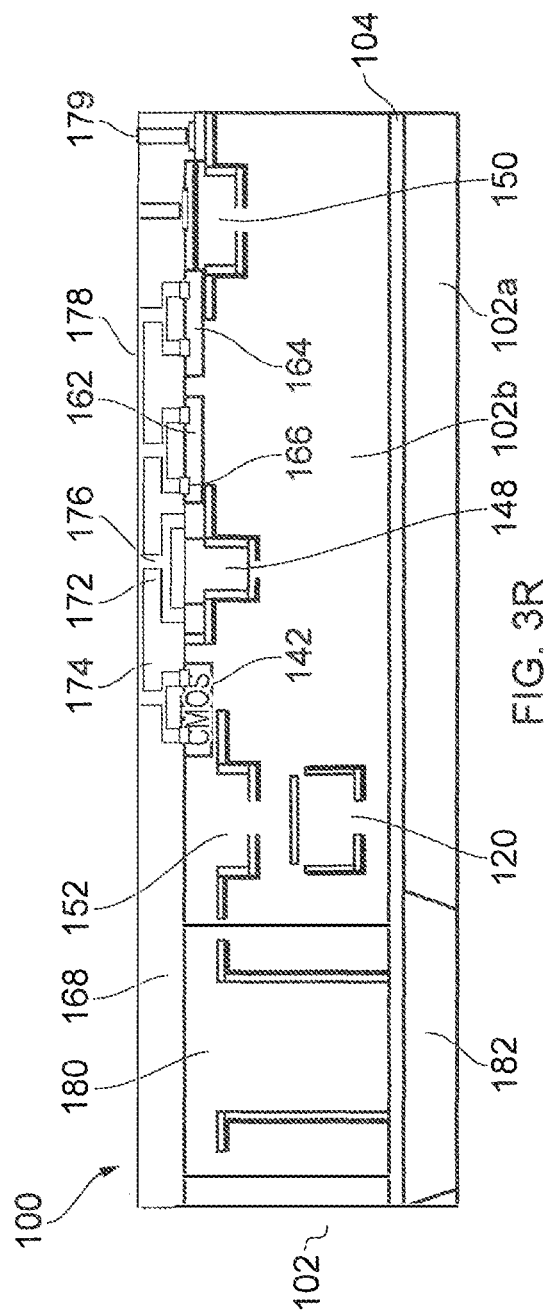

In FIG. 3G, three additional silicon etching steps (with different etch depths) have taken place and in FIG. 3H an oxide layer 136 has been deposited on the walls of the resulting cavities 126, 128, 130, in order to form cavities with oxide sidewalls. In the embodiment shown, one cavity 126 is 3 µm wide, to form a passive component, one cavity 128 is 0.5 to 1 µm wide to form an active component and another cavity 130 is 1 to 2 µm wide and 1 to 2 µm deep to form an evanescent active component. The cavity 128 may be shallower than the cavity 126, and the cavity 130 may be shallower than the cavity 128. Then, as in FIG. 3D, small slots 127, 129, 131 are etched in the base of each of the cavities 126, 128, 130, respectively.

To the left hand side of FIGS. 3G and 3H, two narrow trenches (also referred to as isolation trenches) 132a, 132b have been etched, and also "filled" with an oxide 136 in order to form a 12 µm deep passive waveguide structure 137, having at its base the BOX layer.

Then (with the aid of the small slots 127, 129, 131 at the base of the cavities 126, 128, 130) more silicon 138 is grown epitaxially on top of the structure 100, as shown in FIG. 3I, in order to fill in the cavities 126, 128, 130 to form the waveguide structures 152, 148, 150 having the nature and dimensions as explained above. In FIG. 3J, as with previous drawings, there is a CMP step to flatten the upper surface 140 of the structure 100 now having the waveguide structures 152, 148, 150 buried therein.

All of the fabrication processes shown in FIGS. 3A to 3J have been silicon photonics processes taking place on the photonics line.

The process shown in FIG. 3K is the first of the processes to be performed in the CMOS line. Firstly, a thermal oxide layer 146 is deposited on the upper surface of the structure for subsequent CMOS processing. Then, said CMOS processing takes place, which includes doping and activation to form the CMOS component 142. The oxide layer covering everything except for the CMOS component 142 is an implantation blocking layer (such as a hard mask). The implantation blocking layer covers all of the surface of the integrated structure except the regions which are to be implanted. In embodiments in which there are multiple implantation steps (e.g. p, n, p++, n++), each step needs a hard mask removal then a redeposition of a new hard mask, since p, n, p++, n++ regions and their sizes are different from the others.

FIG. 3K-2 shows an example where p and n implantation steps are performed so as to form a Si diode 143. These Si diode implantation steps may be performed either in the CMOS line or in the photonics line (before the common high temperature activation anneal shared with the CMOS implantations). These photonic implantations may be done either before or after the CMOS implantations but before the common anneal. Special implantation (i.e. non-standard CMOS which means it may be performed in the photonics line) may be needed since deep implantation may be needed to penetrate all of the way down to the bottom of the cavities in the case of waveguides 311 and 312 as shown in FIG. 3K-2. Elsewhere, p-i-n structures 141 may be formed.

At this point in the method, we return to the photonics line. With the CMOS 142 firmly in place, in FIG. 3L, another silicon etch takes place. In order to remove the layers of oxide 146 and crystalline silicon 138 from above the waveguide structures 152, 148, 150 which were deposited in FIGS. 3I to 3K. It should be noted that the BiCMOS processing may occur as a next step in the CMOS line, as in some embodiments the activation anneals in a high Si-content SiGe region may need to be higher than those in a low Si-content SiGe region (as may be used in some photonic devices).

In the specific example shown in FIG. 3L, the silicon in waveguide structure 148 is etched almost entirely away, to leave an empty cavity, whereas in the case of waveguide structure 150, only the silicon above the portion of oxide layer is etched away, so that the upper surface of the remaining silicon is almost flush with the upper surface of the oxide layer 146. This is performed in the photonics line because the high topology processing required to form the features shown in FIG. 3L, along with the lithography and etching can only be performed in a MEMS-type line.

Still in the photonics line, in FIG. 3M, active photonic materials 156, 158 are grown in or on the waveguide structures 148, 150 respectively, and alternative (non-Si) CMOS materials are grown. In the specific embodiment shown, the cavity may be filled, for example, with SiGe or Ge to form an electro-absorption modulator or a photodetector, and the evanescent cavity on the right hand side may be filled with III-V actives to form a laser or an EAM. In other embodiments, SiGe with high silicon content may be used for Bi-CMOS, SiGe with low silicon content may be used for Franz-Keldysh modulators, germanium may be used for photodiodes, and InP may be used for lasers, modulators and III-V CMOS.

In FIG. 3N, in order to flatten the surface 160 of the whole structure, another CMP step is performed.

Next, as shown in FIG. 3O, the device returns to the CMOS line (except in those embodiments where the most recent CMP is performed in the CMOS line). Here, CMOS/SiGe processing and CMOS/III-V processing may occur, which include implantation steps for diodes and also a rapid thermal anneal (RTA). Heterojunction bipolar transistor (HBT) processing may also occur here. Moreover, implantation doping in the waveguide regions 148 and 150 may be performed. Generally this doping will occur after the rapid thermal anneal for previous materials up-stream of this step that have a higher activation temperature, so as to avoid diffusion of the implanted dopants. Alternatively, the doping may occur before any annealing steps, and the annealing steps may be used to diffuse the dopants into an appropriate region of the or each waveguide region. The nature of the doping of the waveguide regions, as will be appreciated, depends on the type of active device or CMOS device contained therein. Generally at least an n and p doped region are provided via implantation. Additional n+/n++ and p+/p++ regions may be provided for electrical contacts.

In some embodiments, multiple material epitaxy growth, doping, anneal, and CMP steps may be required for each material system that is grown. In one example, there may be low-Ge-content SiGe growth, implantation, annealing, CMP, SiGe growth, implantation, annealing, CMP, germanium growth, implantation, annealing, CMP, and InP growth, implantation, annealing, then another CMP, because different materials require different growth temperatures and therefore have different melting temperatures, different materials have different activation annealing temperatures, and also different CMP chemistries. When possible, implantation and annealing steps should be shared when annealing temperatures and material melting temperatures are similar, and CMP steps should be shared when CMP chemistries are similar. Materials that have lower growth and melting temperatures and lower activation anneal temperatures should be processed after the materials that have high temperatures. Furthermore, in other embodiments, a CMP step may be required in the CMOS line where 12-inch CMP tools are available to achieve the uniformity and planarity required for CMOS processing.

Then, in FIG. 3P, in order to provide the conductive traces on the surface of the overall structure, an oxide layer 168 is deposited across the top, and vias 170 are etched into it. The vias 170 are etched so as to provide a channel between the upper surface of the oxide layer and the diodes implanted in FIG. 3O. Then, metallization takes place in order to provide a conductive path between the upper surface of the oxide layer and the diodes below, through the vias 170. The metallized vias are there connected in certain places via conductive traces 172. In FIG. 3Q, another oxide layer 174 is deposited, more vias formed 176, and additional metallization takes place. Again, the metallized vias 176 are then connected by conductive traces 178. CMOS or Bi-CMOS may be connected up with multiple metal layers so that mixed-signal analogue circuitry drives EAMs and receives signal from the PDs, and can also connect to digital functions. The DC laser pads 179 shown at the right-hand side of FIG. 3Q lead off-chip.

In a final step, shown in FIG. 3R, which takes place in a MEMS-style line, additional large scale topography etching takes place for the chip's optical 10. For example, V-groove 182 may be formed, a facet etch 180 may be performed, as well as anti-reflective coating and etching of a dicing lane. The V-groove 182 may be used for incorporation of a passive fibre attach.

Figure 4:
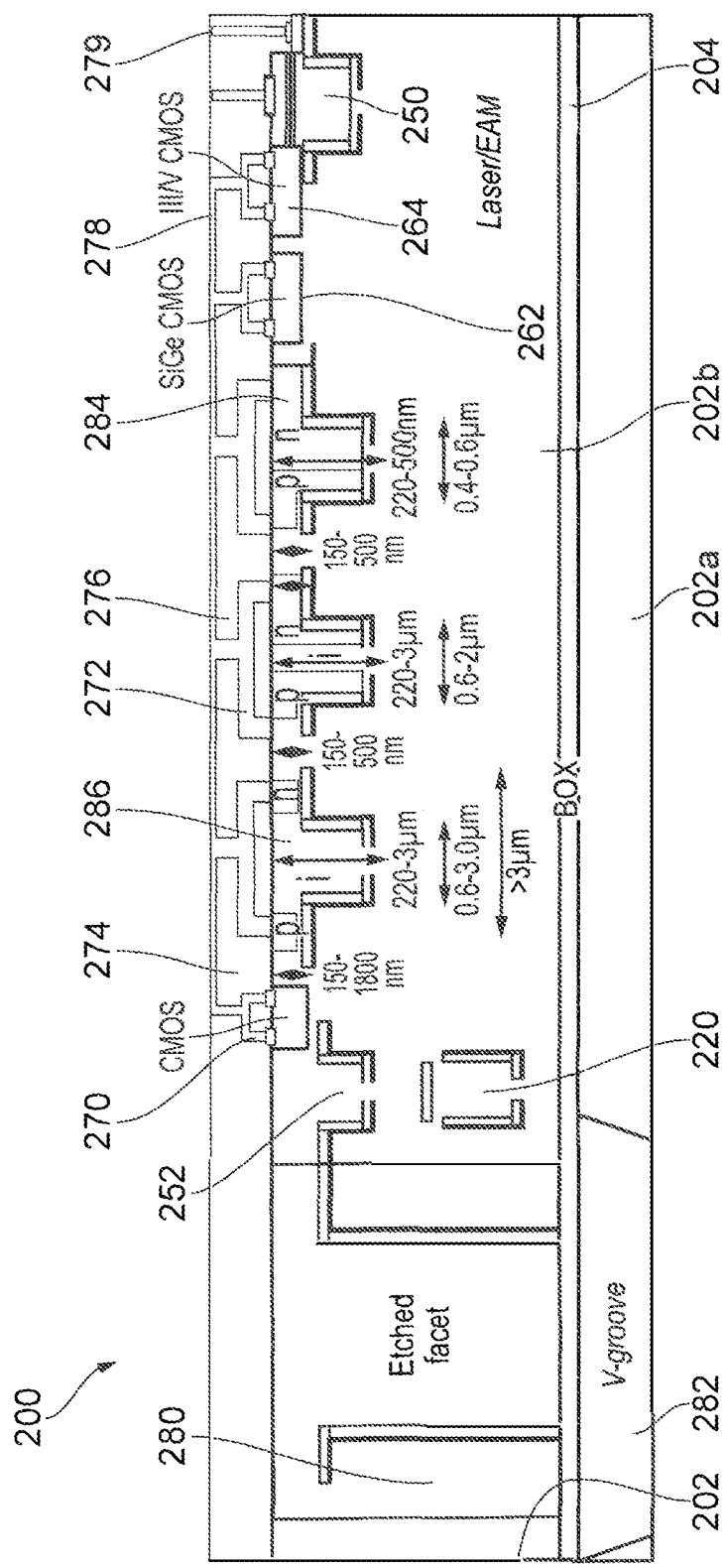
FIG. 4 shows an alternative embodiment of an integrated structure of the present invention.

FIG. 4 shows an alternative finished product 200 which may form another embodiment of the present invention. In FIG. 4, reference numerals for equivalent features from FIGS. 3A to 3R are used with the initial digit "1" replaced by a "2", unless otherwise stated. In this embodiment, additional silicon-only p-n structures 284 or p-i-n active structures 286 are added in at the stage of FIG. 3K. FIG. 4 shows specific dimensions, but the skilled person is well-aware that these need not be limiting. This embodiment shows how silicon-based diodes which can also be used to make silicon active structures (e.g. p-n or p-i-n phase shifters for Mach-Zehnder modulators, p-i-n diodes for variable absorbers or absorption modulators, doped regions for heaters, or diode sensors), can also be incorporated in the platform. Silicon-only p-n or p-i-n active structures such as these may be used instead of, or to augment, the other active structures described above based on other materials, i.e. they can be used with or without the germanium PDs, SiGe EAMs, SiGe CMOS, III-V CMOS, and III-V lasers and modulators.

The method illustrated in FIGS. 3A to 3R all include a buried waveguide structure. However, in some embodiments, no buried waveguide structure is required. In those embodiments, the same processing as are performed in FIGS. 3G to 3Q may be performed starting with an arrangement as shown in FIG. 5, in which there is just an SOI 302 with a 12 μm deep BOX layer 304, and no buried waveguide.

Figure 6A:
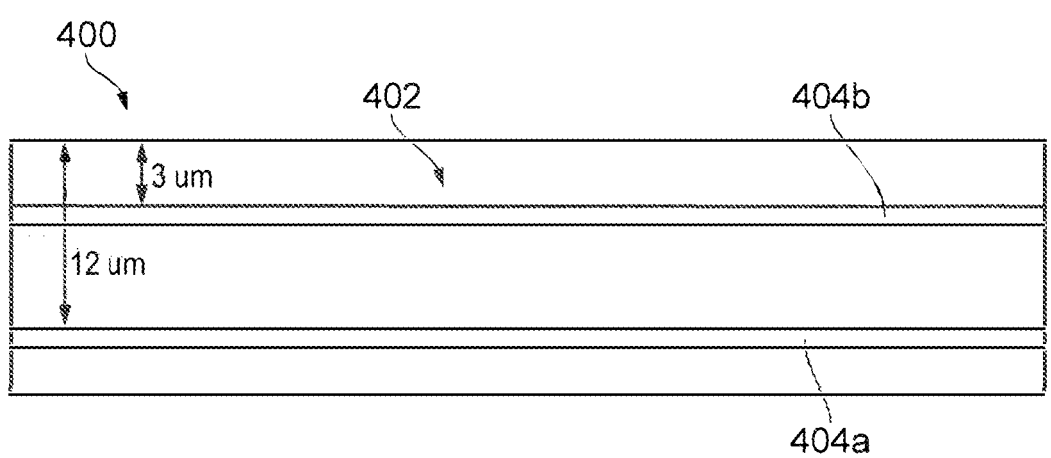
Figure 6B:
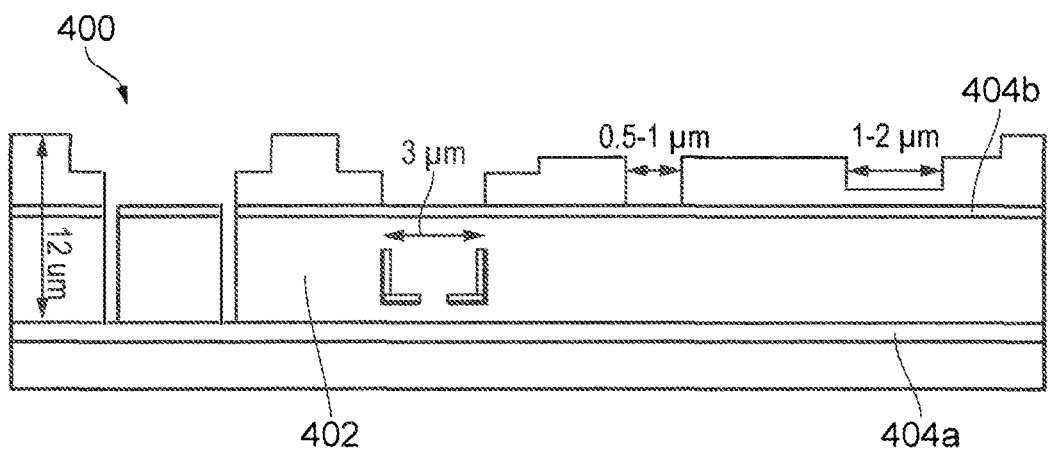
Figure 6C:
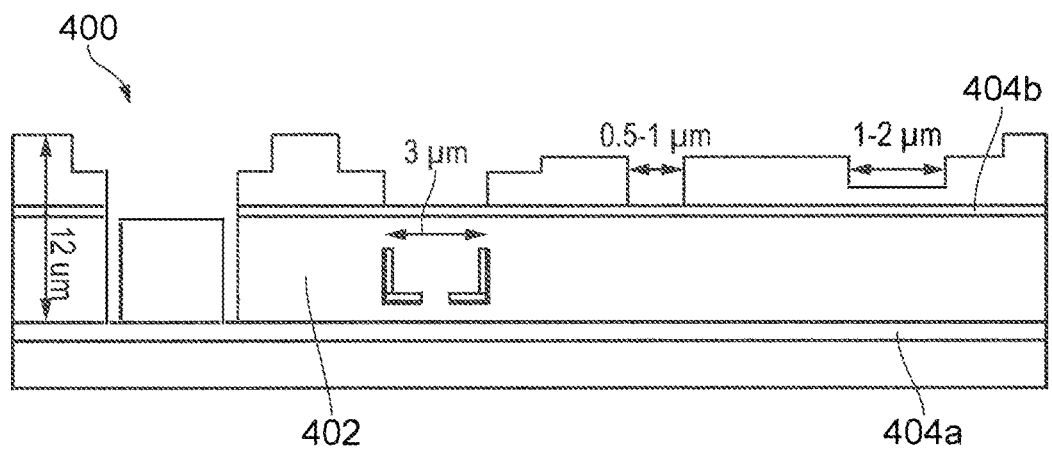
Figure 6D:
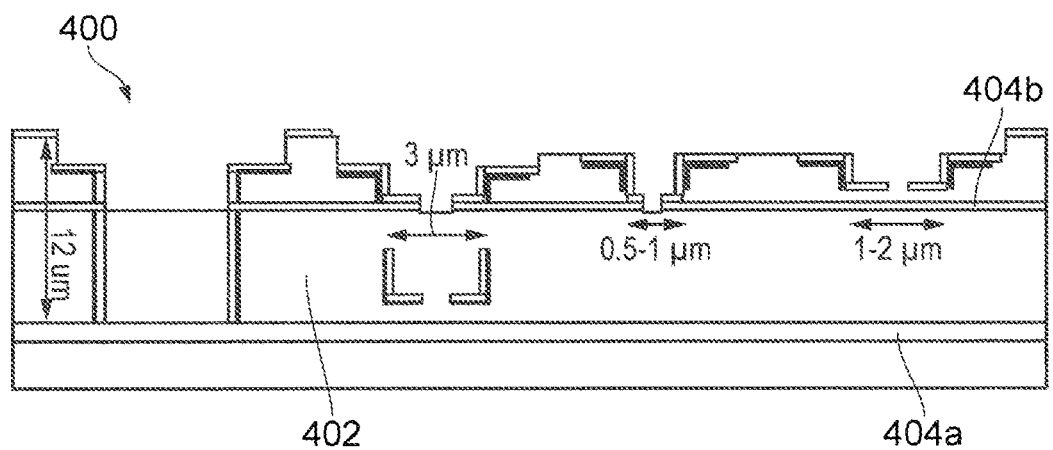

Similarly, in other embodiments, a double SOI (DSOI) 400 may be used, i.e. a silicon wafer 402 having two BOX layers 404a, 404b, shown in FIG. 6A. In this case, one is at 3 μm depth and the other is at 12 μm depth. Clearly, the invention is not limited to these depths of BOX layer which are included for illustrative purposes only. Equivalents to the steps shown in FIGS. 3G and 3H are shown in FIGS. 6B to 6D. These are similar to FIGS. 3G and 3H, except that the deposition step of FIG. 3H is required only to cover the sidewalls of the cavities, rather than the sidewalls and the base. As is shown in FIG. 6D, by beginning with the DSOI, as is the case in this embodiment, it is possible to have cavities in which the sidewalls and the base oxide have different thicknesses, or even a different oxide recipe. Having the second BOX layer at the fixed 3 μm depth means that the silicon seed levels are at roughly the same depth which allows for more homogeneous epitaxial growth height across the wafer, reducing the level of CMP required after that epitaxial growth. Also having the second BOX layer at the fixed 3 μm depth means the buried oxide layer can act as an etch stop for all of the waveguide cavities with 3 μm depth, allowing for the depths of the cavities to be more accurate and uniform across the wafer than what could otherwise be achieved without having this BOX layer.

Figure 7:
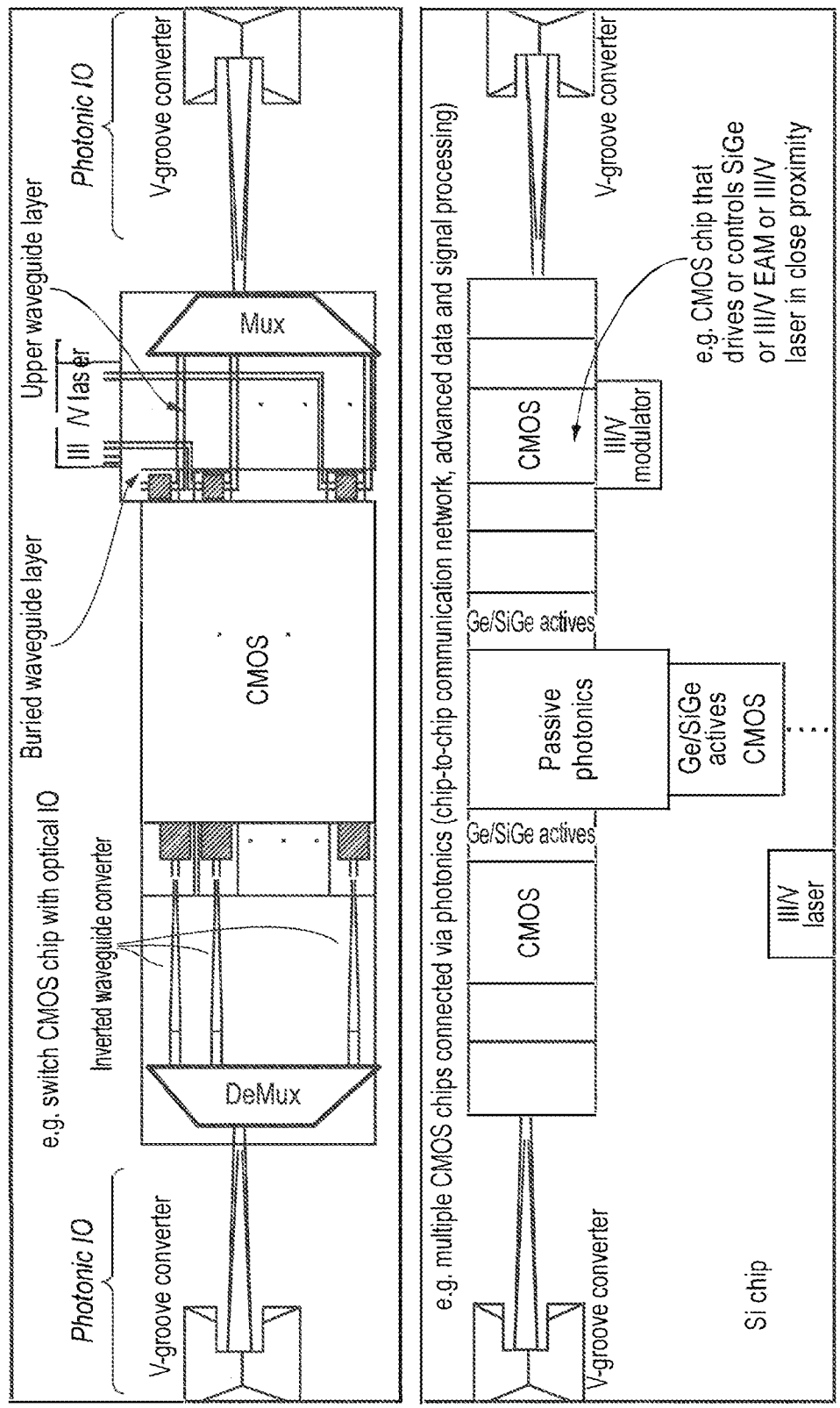
FIG. 7 shows a schematic diagram of a plan view of a chip including the integrated structure of the present invention.

The device (chip) in FIG. 7 has CMOS digital, mixed-signal analogue, and silicon photonic elements and building blocks monolithically integrated together using a process that is described throughout this application. Such a chip allows for co-integration of CMOS and photonics functions at unprecedented densities, and ultra-low cost, but in exchange manufacturing yields would need to be very high so the yields of the photonics processes would need to be very high similar to modern CMOS processes for this to be practical.

The top portion of FIG. 7 describes how a packet switch CMOS chip with photonic 10, one of Rockley Photonics' products, could be made completely monolithically.

The edges of the chip labelled "photonic 10" have the buried taper transitions to 13 μm waveguide size to facilitate fiber attach. The V-groove regions are shown and these allow for direct edge-coupled passive fiber attach, one important advantage of this scheme (this fiber attach platform has low cost to manufacture, low loss, broadband, and polarization insensitive).

Connected to the photonic 10 regions (regions coloured blue) are passive device regions (such as waveguides structures 120, 152 in e.g. FIG. 3J), which typically perform functions such as wavelength multiplexing/demultiplexing, optical filtering, and routing. Note that transitions between the bottom strip waveguide 120 and the top rib waveguide 152 may also be included in this region to enable multilayer waveguides to enable waveguide crossings (two levels are desired to enable waveguide crossings).

Returning to the description of FIG. 7 the passive regions then interface with the active regions. These regions of the modulators and photodiodes, which mainly perform optical modulation (in other words, conversion of electrical signals from the CMOS to optical signals by way of the Bi-CMOS modulator drivers) and optical detection (conversion of optical to electrical by way of Bi-CMOS photodiode receiver circuits). Bi-CMOS modulator drivers and receiver circuits are shown respectively to the left and right of the CMOS chip in the top section of FIG. 7.

The modulator driver and detector receiver circuitry could also simply be in CMOS, in which case the Bi-CMOS boxes would not be needed.

Light sources are needed to generate the light that is outputted from the modulators, therefore III-V laser regions, shown in orange, are included on some edge-regions of the chip. These regions may be arrays of lasers, either external cavity (distributed Bragg reflector or DBR) lasers, where grating mirrors are in the passive silicon waveguides (a type of filtering function, already mentioned), or distributed feedback (DFB) lasers, where the laser mirrors are embedded in the III-V material and the silicon waveguide is just a passive waveguide. The laser light needs to enter into one of the ports of the modulator (the input port), so lines are shown (in e.g. FIG. 3Q) connecting the lasers to one side of the modulators. Because these waveguides need to cross over the modulator output waveguides, the laser waveguides are shown to have some portion on a different layer (i.e. buried slab waveguide layer 140 in FIG. 3J) from the EAM input and output waveguides, so that they can cross over each other with no loss (this is an example of the two layer waveguides needed for waveguide crossing as described above).

Finally the Bi-CMOS modulator driver and receiver circuitry connect to a CMOS region in the centre, where the digital functions are performed.

It should be noted that the modulator regions could instead be made of III-V material, looking very much like the laser material.

The bottom part of FIG. 7 shows a different way of connecting up the different functions made of the different materials in different ways for different applications. The photonics would still be used as optical I/O but now multiple CMOS chips are shown, connected together with optical 10 on the same chip, to form a multi-chip network, or chip-to-chip network. The functions of the different blocks are same as above, but they are arranged differently. The III-V regions may need to be in close proximity to the CMOS chip just like the SiGe modulators because the Ill-V regions could also be modulators (as described above).

The bottom chip of FIG. 7 is meant to represent other possible applications of this technology, such as a sensor or signal processing chip where the CMOS chip is not a datacentre switch, but a signal processer requiring optical I/O, or a sensor processing chip, where the CMOS does some signal analysis and/or DSP, and needs to drive a passive phase array, or connect to an array of low speed detectors. This could require direct connections to passive region with no modulator in between, or modulators and detectors with low speed drivers that don't require Bi-CMOS.

The invention claimed is:

1. An optoelectronic device, comprising:
    a first silicon layer having a bottom surface and a top surface; and
    a first waveguide in the first silicon layer, the first waveguide having a propagation region confined by:
        a base above the bottom surface and below the top surface, and
        a first sidewall extending from the base towards the top surface,
    wherein each of the base and the first sidewall comprise oxide, and
    wherein the first waveguide comprises silicon.

2. The optoelectronic device of claim 1, further comprising a CMOS component in the first silicon layer.

3. The optoelectronic device of claim 1, wherein the optoelectronic device is on a silicon-on-insulator wafer comprising:
    a silicon substrate;
    a buried oxide (BOX) layer above the silicon substrate; and
    the first silicon layer above the BOX layer.

4. The optoelectronic device of claim 1, wherein the optoelectronic device is on a double silicon-on-insulator wafer comprising:
    a silicon substrate;
    a first buried oxide (BOX) layer above the silicon substrate;
    the first silicon layer above the first BOX layer;
    a second BOX layer above the first silicon layer; and
    a second silicon layer above the second BOX layer.

5. The optoelectronic device of claim 1, further comprising a second waveguide,
    wherein the first and second waveguides overlap each other in a plan view.

6. The optoelectronic device of claim 1, further comprising a CMOS component in the first silicon layer, wherein a width of the first waveguide is greater than 2 µm and less than or equal to 13 µm.

7. The optoelectronic device of claim 6, wherein the width of the first waveguide is greater than or equal to 3 µm.

8. The optoelectronic device of claim 7, wherein the width of the first waveguide is greater than or equal to 4 µm.

9. The optoelectronic device of claim 6, wherein the optoelectronic device is on a silicon-on-insulator wafer comprising:
    a silicon substrate;
    a buried oxide (BOX) layer above the silicon substrate; and
    the first silicon layer above the BOX layer.

10. The optoelectronic device of claim 9, further comprising:
    an oxide layer on the first silicon layer; and
    a conductive trace on the oxide layer and connected to the CMOS component through a via in the oxide layer.

11. The optoelectronic device of claim 6, wherein the optoelectronic device is on a double silicon-on-insulator (DSOI) wafer comprising:
    a silicon substrate;
    a first buried oxide (BOX) layer above the silicon substrate;
    a second silicon layer above the first BOX layer;
    a second BOX layer above the second silicon layer; and
    the first silicon layer above the BOX layer.

12. The optoelectronic device of claim 6, wherein the CMOS component comprises a transistor.

13. The optoelectronic device of claim 6, wherein the propagation region is further confined by a second sidewall extending from the base towards the top surface, and
    wherein the base, the first sidewall, and the second sidewall define a rib of the first waveguide.

14. The optoelectronic device of claim 6, further comprising a second waveguide,
    wherein the first and second waveguides overlap each other in a plan view.

15. The optoelectronic device of claim 6, further comprising an optically active component or an evanescent active component in the first silicon layer.

16. An optoelectronic device, comprising:
    a first silicon layer having a bottom surface and a top surface; and
    a first waveguide in the first silicon layer, the first waveguide having a propagation region confined by:
        a base above the bottom surface and below the top surface, and
        a first sidewall extending from the base towards the top surface,
    wherein the propagation region of the first waveguide is further confined by a cap above the base, the first sidewall extending from the base to the cap.

17. An optoelectronic device, comprising:
    a first silicon layer having a bottom surface and a top surface; and
    a first waveguide in the first silicon layer, the first waveguide having a propagation region confined by:
        a base above the bottom surface and below the top surface, and
        a first sidewall extending from the base towards the top surface,
    wherein the base has an opening exposing the first waveguide to a portion of the first silicon layer below the base.

18. An optoelectronic device, comprising:
a first silicon layer having a bottom surface and a top surface; and
a first waveguide in the first silicon layer, the first waveguide having a propagation region confined by:
   a base above the bottom surface and below the top surface, and
   a first sidewall extending from the base towards the top surface,
wherein the first waveguide is a rib waveguide comprising a slab region and a rib extending downward from the slab region toward the bottom surface,
wherein the propagation region of the first waveguide is further confined by a second sidewall, and
wherein the rib is defined by the base, the first sidewall, and the second sidewalls.

* * * * *